United States Patent [19]
Matsumura

[11] Patent Number: 6,069,481
[45] Date of Patent: May 30, 2000

[54] SOCKET FOR MEASURING A BALL GRID ARRAY SEMICONDUCTOR

[75] Inventor: Shigeru Matsumura, Saitama, Japan

[73] Assignee: Advantest Corporation, Tokyo, Japan

[21] Appl. No.: 08/875,205

[22] PCT Filed: Oct. 31, 1995

[86] PCT No.: PCT/JP95/02224

§ 371 Date: Jan. 21, 1998

§ 102(e) Date: Jan. 21, 1998

[87] PCT Pub. No.: WO97/16874

PCT Pub. Date: May 9, 1997

[51] Int. Cl.[7] .......................... G01R 31/02; G01R 1/073
[52] U.S. Cl. .......................................... 324/755; 324/761
[58] Field of Search ................................. 324/755, 761, 324/754, 758, 765; 439/682, 66, 71, 331

[56] References Cited

U.S. PATENT DOCUMENTS

| | | | |
|---|---|---|---|
| 3,286,220 | 11/1966 | Marley et al. | 439/682 |
| 3,359,533 | 12/1967 | Barry | 439/682 |
| 3,596,234 | 7/1971 | Sapienza et al. | 439/682 |
| 5,498,970 | 3/1996 | Petersen | 324/755 |
| 5,518,410 | 5/1996 | Masami | 324/761 |

FOREIGN PATENT DOCUMENTS

| | | |
|---|---|---|
| 56-162482 | 12/1981 | Japan . |
| 2-309579 | 12/1990 | Japan . |
| 6-203926 | 7/1994 | Japan . |
| 6-309579 | 11/1994 | Japan . |
| 6-86293 | 12/1994 | Japan . |
| 9-83656 | 3/1996 | Japan . |

*Primary Examiner*—Ernest Karlsen
*Attorney, Agent, or Firm*—Staas & Halsey

[57] ABSTRACT

A ball grid array semiconductor measuring socket is provided in which a contact pressure force to a solder ball is generated in the direction substantially orthogonal to the longitudinal direction of a forked contact pin and the length of the forked contact pin can be designed to the required minimum length independently of the contact pressure force. The forked contact pin formed by stamping out a sheet metal having a resilience into a tuning fork shape is mounted in a receiving hole formed through an insulating housing. Each forked contact pin is constructed so that the tip portions of a pair of elastic forked portions form contact portions for contacting with a solder ball 12 and that the tip portions contact with a solder ball at two points. In addition, the direction of opposed areas in which a pair of elastic forked portions of the forked contact pin is accommodated is selected to be oblique to the direction of the alignment of the receiving holes, and thus the mounting density of the forked contact pins can be improved.

7 Claims, 7 Drawing Sheets

SOCKET FOR MEASURING A BALL GRID ARRAY SEMICONDUCTOR

BACKGROUND OF THE INVENTION

1. Field of the Invention

The present invention relates to a socket for measuring a semiconductor device received in a package of Ball Grid Array structure (a package having a substrate on the surface of which a semiconductor device is mounted and on the opposite surface of which solder balls are formed in the form of grating). More particularly, the present invention relates to a socket for a Ball Grid Array structure package (hereinafter referred to as BGA package) which is applied to a semiconductor integrated circuit testing apparatus (commonly called an IC tester) for testing a semiconductor integrated circuit (IC) in order to electrically connect between the solder balls of the BGA package which are terminals or electrodes thereof and the IC tester side, though the present invention is not limited thereto.

2. Description of the Related Art

With ICs formed in high density, many leads are required for leading out the internal circuits of an IC, and it is difficult to arrange these many leads in straight lines on a package in which the IC is accommodated because the leads are too much to put thereon.

Figure 5:
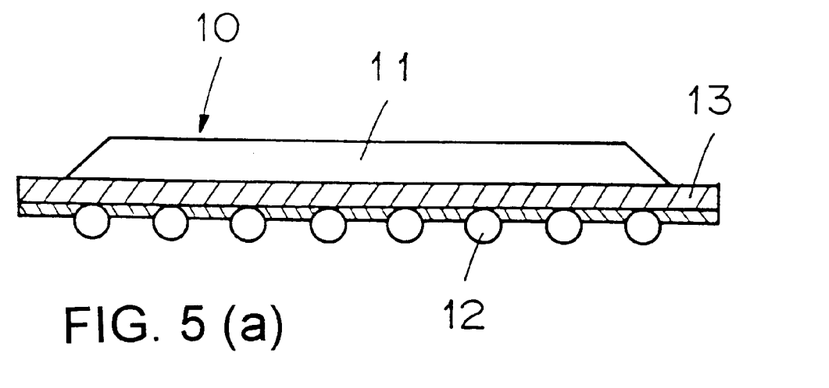
FIG. 5(a) is a sectional view in outline of the prior BGA package and FIG. 5(b) is a bottom view of FIG. 5(a)

From the above reason, recently, as shown in FIGS. 5(a) and 5(b), there is being put to practical use an IC package 10 having a substrate 13 made of, for example, a ceramic or plastic material in which an IC (not shown) is mounted on the surface of the substrate 13 and minute balls 12 each made of a solder functioning as terminals or electrodes are two-dimensionally arranged in the form of a matrix on the bottom surface of the substrate 13. Such IC package is called a BGA package as stated above. The internal circuits, i.e., IC of this BGA package are sealed by a mold denoted by a reference numeral 11 and the wiring of the IC is electrically connected to the solder balls 12 via printed circuits formed on the substrate 13.

In order to test the BGA package 10 mentioned above by the IC tester, it is necessary to electrically connect between the solder balls 12 which are the terminals or the electrodes of the BGA package 10 and the IC tester side. This electrical connection is achieved by interposing a socket for measuring a BGA package between the BGA package 10 and the IC tester.

Figure 6:
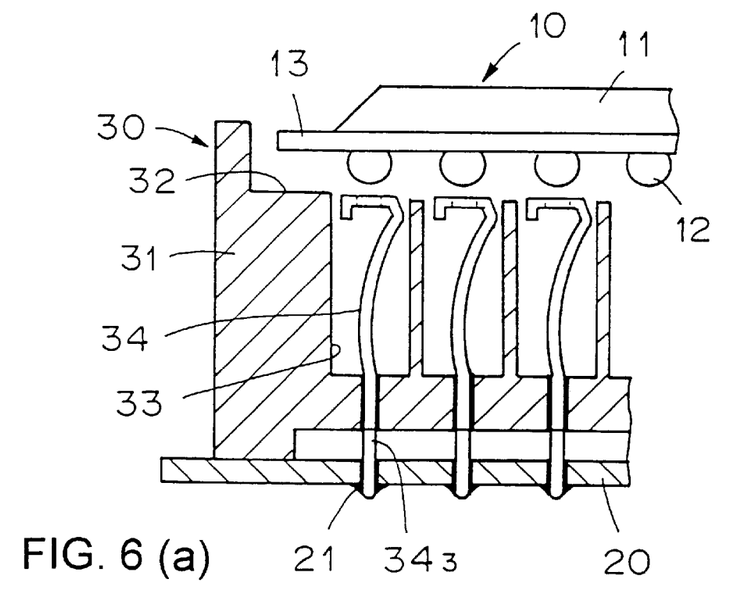
FIG. 6(a) is a section view in outline of the prior BGA package measuring socket and FIG. 6(b) is a perspective view showing an example of the contact pine used in this socket.

An example of a conventional BGA package measuring socket is shown in FIG. 6(a). This BGA package measuring socket as generally indicated by a reference numeral 30 is mounted on a printed circuit board 20 which is a part of the IC tester side. This printed circuit board 20 has apertures (through-holes) 21 pierced at the positions thereof corresponding to the respective solder balls 12 arranged in a matrix on the bottom surface of the BGA package 10. A terminal portion $34_3$ of each of contact pins 34, described later in detail, is inserted into each of the through-holes 21. Therefore, the solder balls 12 of the BGA package 10 are electrically interconnected to a measuring circuit of the IC tester via the contact pins 34 of the BGA package measuring socket 30, respectively.

The BGA package measuring socket 30 includes a housing 31. This housing 31 is formed by working a thick plate-like body of an insulating material and has a mounting recess 32 formed on the upper surface of the housing 31, on which a BGA package 10 is mounted for testing. In addition, many pockets 33 extending from the position of the mounting recess 32 to the proximity of the bottom of the housing 31 are formed in the housing. These pockets 33 are provided to accommodate the contact pins 34 therein, respectively. Therefore, these pockets 33 are formed at the positions of the housing corresponding to the solder balls 12 arranged in a matrix on the bottom surface of the BGA package 10 mounted on the mounting recess 32 and are arranged in the form of a matrix as with the solder balls 12.

Each of the contact pins 34 is fabricated from a sheet metal having a resilience such as beryllium copper, phosphor bronze or the like by forming a strip from such sheet metal as the raw material and bending and deforming the strip by press working so as to have a vertical section substantially like a numeral "7" as can be understood from FIG. 6(a). In this press working, as shown in FIG. 6(b) in enlarged size, the contact portion $34_1$ of the top of the contact pin 34 to be brought into contact with the corresponding solder ball 12 is formed into a flat surface of an approximately regular square at the central portion of which a circular opening is formed. This circular opening is smaller in diameter than the solder ball 12. In addition, a portion of the contact pin 34 adjacent to the contact portion $34_1$ is formed as a curved portion $34_2$ for giving an elasticity in up-and-down direction to the contact pin 34 and extends in substantially vertical direction from the contact portion $34_1$ to the bottom of the housing. A flat rectangular plate-shaped base is formed in vertical direction at the lower side of the curved portion $34_2$ and is fitted into a hole or slit formed on the bottom of the housing. A pin-shaped terminal portion $34_3$ pending downwardly from the plate-shaped base is formed integrally with the plate-shaped base. As mentioned above, this pin-shaped terminal portion $34_3$ is inserted into the corresponding through-hole 21 pierced through the printed circuit board 20.

Each contact pin 34 thus construcetd is fixed to the housing 31 of the BGA package measuring socket 30 by fitting and fixing the plate-shaped base of the contact pin 34 positioned above the terminal portion $34_3$ thereof into the corresponding hole formed on the bottom of the housing 31.

The BGA package measuring socket 30 is placed on the printed circuit board 20 which constitutes a part of the IC tester side in the state that the tip of the terminal portion $34_3$ of each contact pin 34 is inserted into the through-hole 21 of the printed circuit board 20. Then, as shown in the drawing, the tip of the terminal portion $34_3$ of each contact pin 34 and a printed circuit formed around the through-hole 21 are soldered with each other on the back surface of the printed circuit board 20. By this process, the BGA package measuring socket 30 is fixed on the printed circuit board 20 and is electrically connected to the IC tester.

In such state, when a BGA package 10 to be measured is loaded onto the mounting recess 32 of the BGA package measuring socket 30 and is maintained under the condition that a downward pressure is applied thereto, each of the solder balls 12 on the under side of the BGA package 10 is engaged and held in pressure contact with the circular hole of the contact portion $34_1$ of each contact pin 34 of the BGA package measuring socket 30. This pressure contact force is generated by a reaction of the curved portion $34_2$ of the contact pin 34 caused by the downward pressure applied to the BGA package 10. In such a way, when each of the solder balls 12 on the back surface of the BGA package 10 is in pressure contact with the corresponding contact portion $34_1$ of each of the contact pins 34 of the BGA package measuring socket 30, the BGA package 10 is electrically connected to the IC tester side and a test for the BGA package 10 can be carried out.

The conventional BGA package measuring socket 30 uses the contact pin 34 as mentioned above. In this socket 30, the pressure contact force caused between each solder ball 12 on the under surface of the BGA package 10 and the contact portion $34_1$ of each contact pin 34 is generated by the curved portion $34_2$ of each contact pin 34 as discussed above, and therefore, in order to obtain a required pressure contact force, the length of the curved portion $34_2$ cannot be made shorter than a certain critical value. That is, in order to ensure the required pressure contact force, the entire length of the contact pin 34 is obliged to become relatively longer. The longer the entire length of the contact pin 34 becomes the higher the height of the socket housing 31 becomes, and hence the degree of the curvature of the curved portion $34_2$ becomes larger, resulting in that the dimension or size of the contact pin is increased in the direction perpendicular to the length-wise direction of the contact pin. Consequently, the packaging density of the contact pin 34 is lowered. Moreover, due to the increased entire length of the contact pin 34, various restrictions are added to the shape and structure of the housing 31, and thus the manufacturing cost is increased. Further, since the floating inductance and the floating capacitance are increased as the entire length of the contact pin 34 is increased, the longer length of the contact pin is also not desirable from the electrical view point. For example, it is difficult that a test for a BGA package at high frequency such as 100 MHz or so is carried out.

Another example of the conventional BGA package measuring socked is shown in FIGS. 7(a) and 7(b). This BGA package measuring socket 30 is almost the same as the prior art example shown in FIG. 6 concerning the shape and structure of the housing 31. That is, this housing 31 is also formed by working a thick plate-like body of an insulating material. On the upper surface of the housing is formed a mounting recess 32 on which a BGA package 10 is mounted for testing. In addition, many pockets 33 extending vertically are formed in the housing for accommodating probe pins 35 described later therein. These pockets 33 are through-holes passing through from the upper surface of the housing to the under surface thereof in this example, and are formed at the positions of the housing corresponding to the solder balls 12 arranged in a matrix on the bottom surface of the BGA package 10 mounted on the mounting recess 32 and arranged in the form of a matrix as with the solder balls 12.

Each probe pin 35 includes a cylindrical tube $35_1$ made of a conductive metal as shown in section of the probe pin 35 in FIG. 7(b). The upper end and the lower end of the tube $35_1$ are both closed and a circular hole $35_2$ of small diameter is formed at the center of each of the closed ends. Within the tube $35_1$ are housed disk-shaped bases of a pair of contacts $35_3$ each made of a conductive metal. A contact pin ($35_3$) standing upright from each of the bases is led out through each of the circular holes $35_2$. A compressed coil spring $35_4$ made of a conductive metal having an elasticity is interposed between the bases of both contacts $35_3$ under compressed condition. Accordingly, both contacts $35_3$ are always pushed toward outside of the tube by the pressure force of the coil spring $35_4$.

In this case, the inner diameter of the cylindrical tube $35_1$ and the outer diameter of the disk-shaped base of each contact $35_3$ are selected so that the peripheral surface of the base of the contact $35_3$ can move up and down as it slides on and in electrical contact with the inner surface of the tube $35_1$. The diameter of the contact pin of the contact $35_3$ is also selected so that the contact pin can freely move through the small circular hole $35_2$ formed in the closed end. In case of practically assembling the above-stated probe pin 35, both the contacts $35_3$ with the coil spring $35_4$ between their bases are inserted into the tube $35_1$ whose upper end and lower end are open. Then, the upper and the lower ends of the tube $35_1$ are closed by plastic working so that the disk shaped bases of both the contacts $35_3$ and the coil spring $35_4$ are confined in the tube with the coil spring $35_4$ compressed between those bases. However, each of the circular holes $35_2$ of small diameter formed in the closed ends at the center thereof is left as it is.

The BGA package measuring socket 30 is placed on the printed circuit board 20 which forms a part of the IC tester side and positioned thereon. For this positioning, the tip of the contact pin of the lower contact $35_3$ of the probe pin 35 is contacted with a predetermined printed circuit portion on the printed circuit board 20 of the IC tester side. In this state, the BGA package 10 is loaded on the mounting recess 32 of the BGA package measuring socket 30. Then, a downward pressure is applied to the BGA package 10 and is kept thereon. Then, the solder ball 12 on the back surface of the BGA package 10 is kept in the state of pressure contact with the tip of the contact pin of the upper contact $35_3$ of the probe pin 35. The force for keeping the pressure contact is generated by the reaction of the coil spring $35_4$ of the probe pin 35 against the downward pressure applied to the BGA package 10. In such a way, the BGA package 10 is electrically connected to the IC tester side by pressure contacting the solder ball 12 on the back surface of the BGA package 10 with the tip of the contact pin of the probe pin 35 of the BGA package measuring socket 30. And thus, the test of the BGA package 10 can be carried out.

Figure 7:
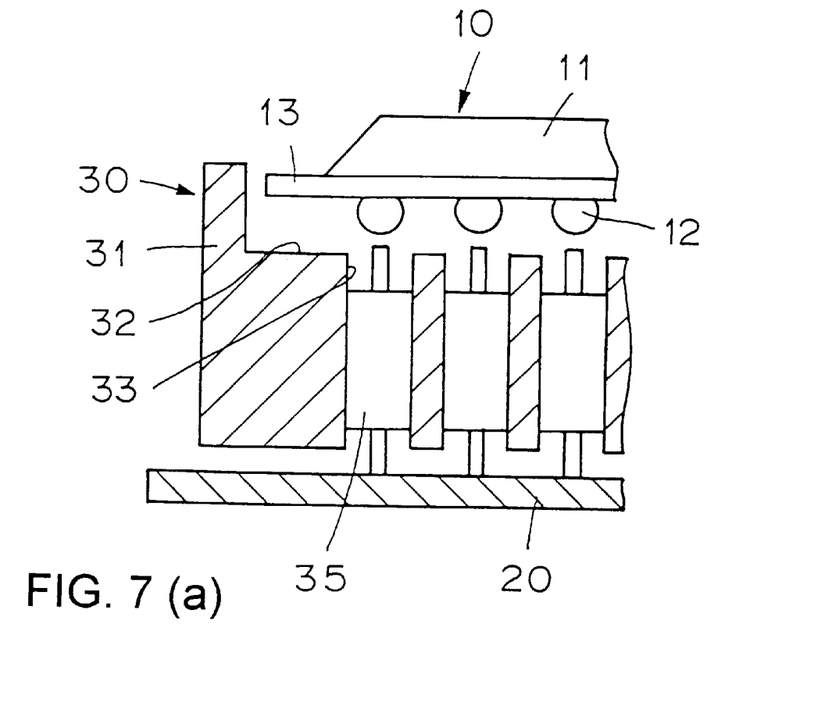
FIG. 7(a) is a sectional view in outline of the prior BGA package measuring socket and FIG. 7(b) is a sectional view showing an example of the probe pin used in this socket.

The BGA package measuring socket 30 shows in FIG. 7 uses the probe pin 35 as mentioned above. In this socket 30, the pressure contact force between the solder ball 12 on the back surface of the BGA package 10 and the tip of the contact pin of the upper contact $35_3$ of the probe pin 35, and the pressure contact force between the predetermined wiring portion of the printed circuit board 20 of the IC tester side and the tip of the contact pin of the lower contact $35_3$ are generated by the coil spring $35_4$ of the probe pin 35. Therefore, in order to obtain the required pressure contact force, the length of the coil spring $35_4$ cannot be made shorter than a certain threshold length. Therefore, in order to guarantee the required pressure contact force, the entire length of the coil spring $35_4$ is made relatively longer. The longer entire length of the coil spring $35_4$ increases the floating inductance and the floating capacitance. This is not desirable from electrical view point. For example, the test at high frequency of about 100 MHz is difficult to be carried out. In addition, the probe pin 35 comprises a cylindrical tube $35_1$ whose diameter is equal to or less than 1 mm. If the entire length of the probe pin 35 is extended, various constraints are added to the shape and the structure of the components of the probe pin 35. Thus, the manufacturing cost is increased.

Furthermore, as shown in FIG. 7(b), the conductive path within the probe pin 35 runs from the tip of the contact pin of the upper contact $35_3$ to the contact portion between the circumference surface of the base portion and the inner wall of the tube $35_1$ via the contact pin. The conductive path further runs from this contact portion to the other contact portion between the circumference surface of the base portion of the lower contact $35_3$ and the inner wall of the tube $35_1$ via the cylindrical tube, and further from this contact portion to the tip of the contact pin of the lower contact $35_3$. Therefore, there are four contact portions on the conductive path of the probe pin 35. That is, a contact between the solder ball 12 and the tip of the contact pin of the upper contact $35_3$, a contact between the circumference surface of the base portion of the upper contact $35_3$ and the inner wall of the cylindrical tube $35_1$, a contact between the inner wall of the cylindrical tube $35_1$ and the circumference surface of the base portion of the lower contact $35_3$, and a contact between the tip of the contact pin of the lower contact $35_3$ and the predetermined printed wiring portion of the printed circuit board 20 of the IC tester side are the four contact portions.

Further, since the contact states of those four contact portions are not necessarily good enough, the contact states are not stable. Therefore, a conductive path from the upper contact $35_3$ to the lower contact $35_3$ via the soil spring $35_4$ is sometimes formed instead of the conductive path mentioned above.

SUMMARY OF THE INVENTION

The present invention provides a BGA package measuring socket which can remove the problems caused by the aforementioned prior art BGA package measuring socket.

According to one aspect of the present invention, there is provided a BGA package measuring socket comprising forked contact pins each of which is formed by stamping out a sheet metal having a resilience into a tuning fork shape.

Each of the forked contact pins is formed by stamping out a sheet metal such as beryllium copper, phosphor bronze or the like having a resilience, and the tip portions of a pair of elastic portions forked into two branches are used as the contact portions with a solder ball of the BGA package. Each of these forked contact pins is accommodated in a corresponding receiving hole formed through a housing made of an insulating material. The opposed areas in each receiving hole in which a pair of elastic forked portions of a forked contact pin is accommodated are formed in an oblique direction to the direction of the alignment of the receiving holes in plan.

In a specific embodiment, the direction of the opposed areas of a receiving hole for accommodating a pair of elastic forked portions of a forked contact pin is selected to be oblique by 45° to the direction of the alignment of the receiving holes.

DESCRIPTION OF THE PREFERRED EMBODIMENTS

Now an embodiment of the present invention will be described with reference to FIGS. 1 to 4.

Figure 1:
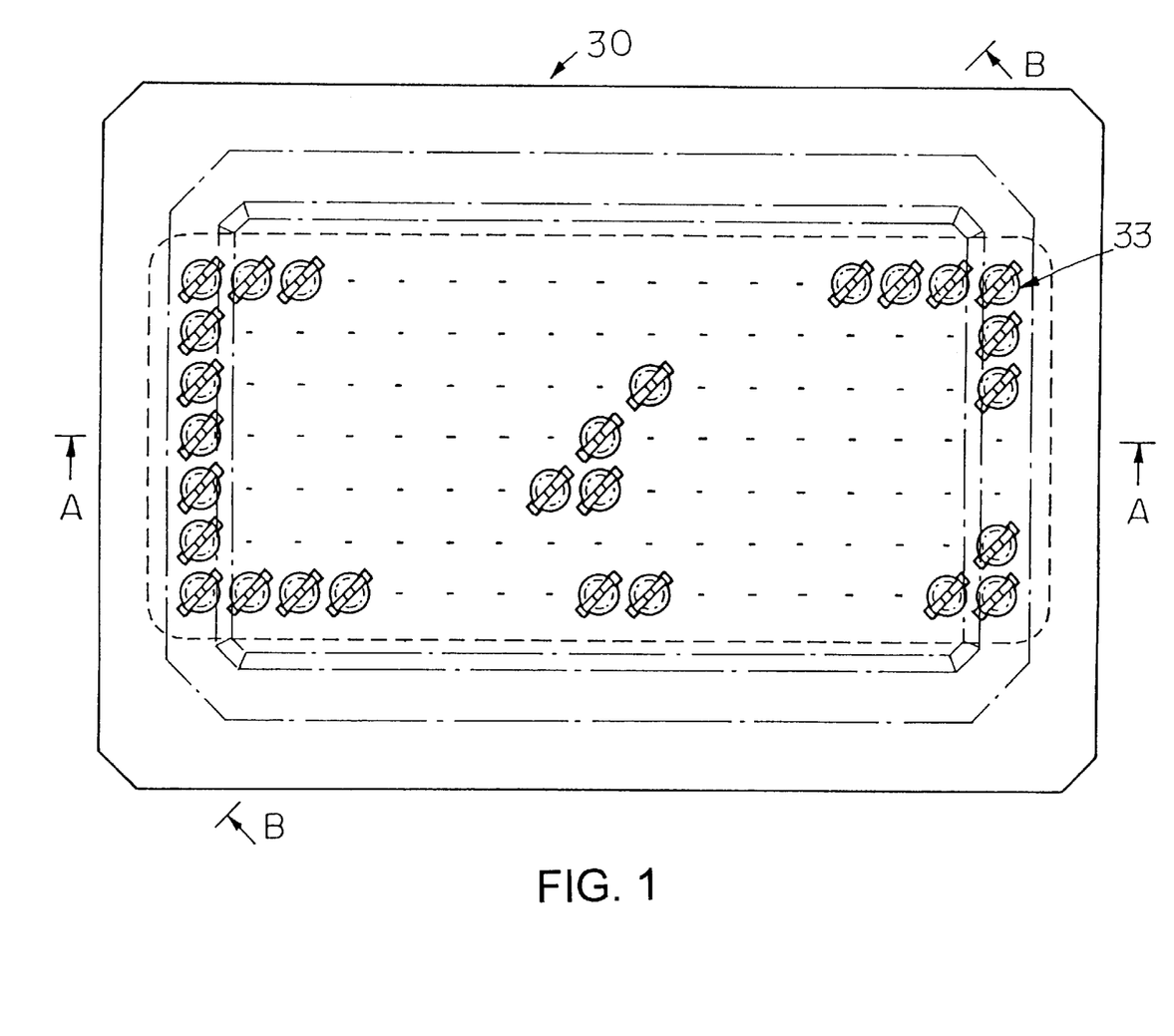
FIG. 1 is a plan view showing an embodiment of the BGA package measuring socket according to the present invention.
Figure 2:
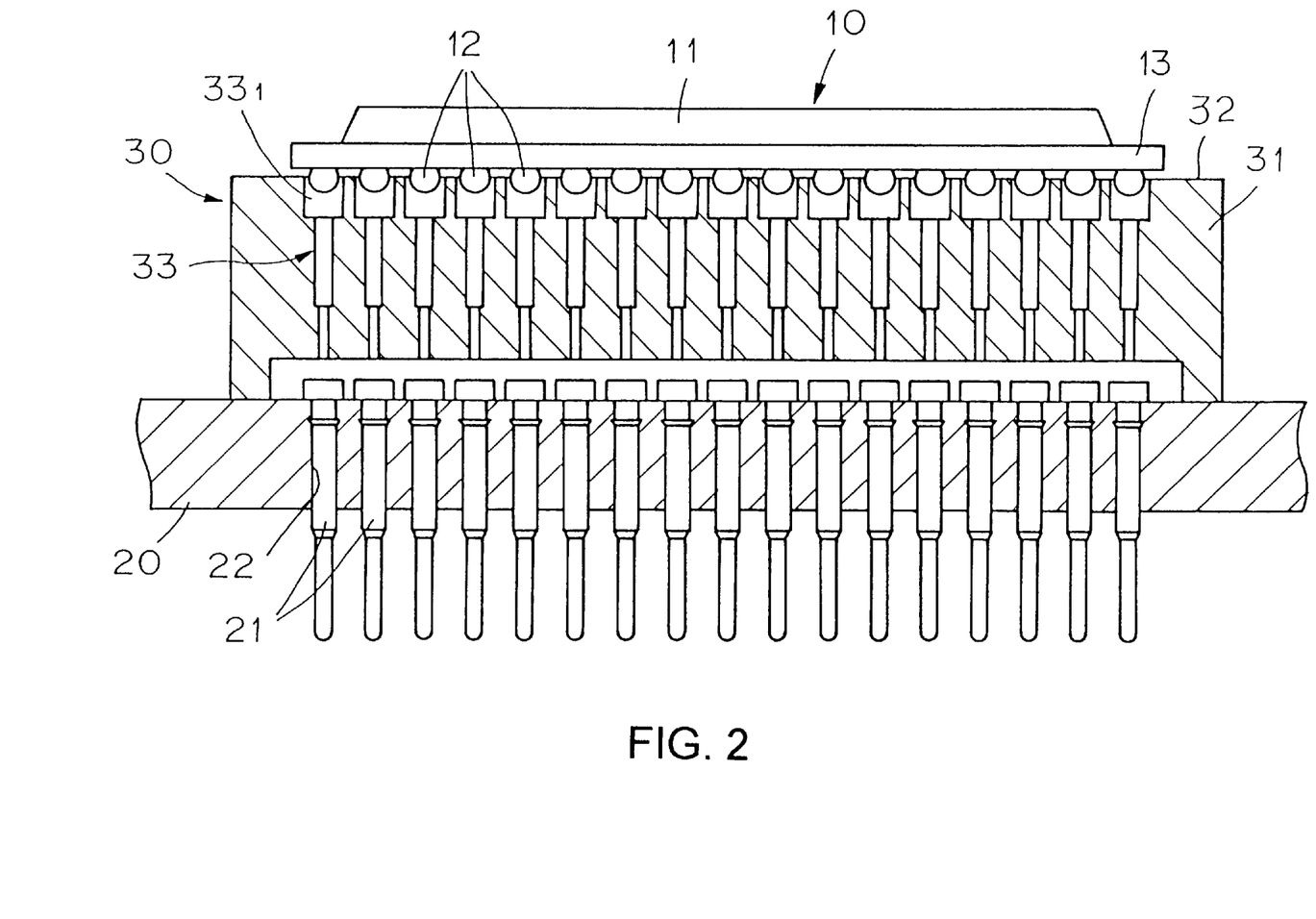
FIG. 2 is a sectional view of FIG. 1 taken along a line A—A in FIG. 1 in which contact pins are removed.
Figure 3:
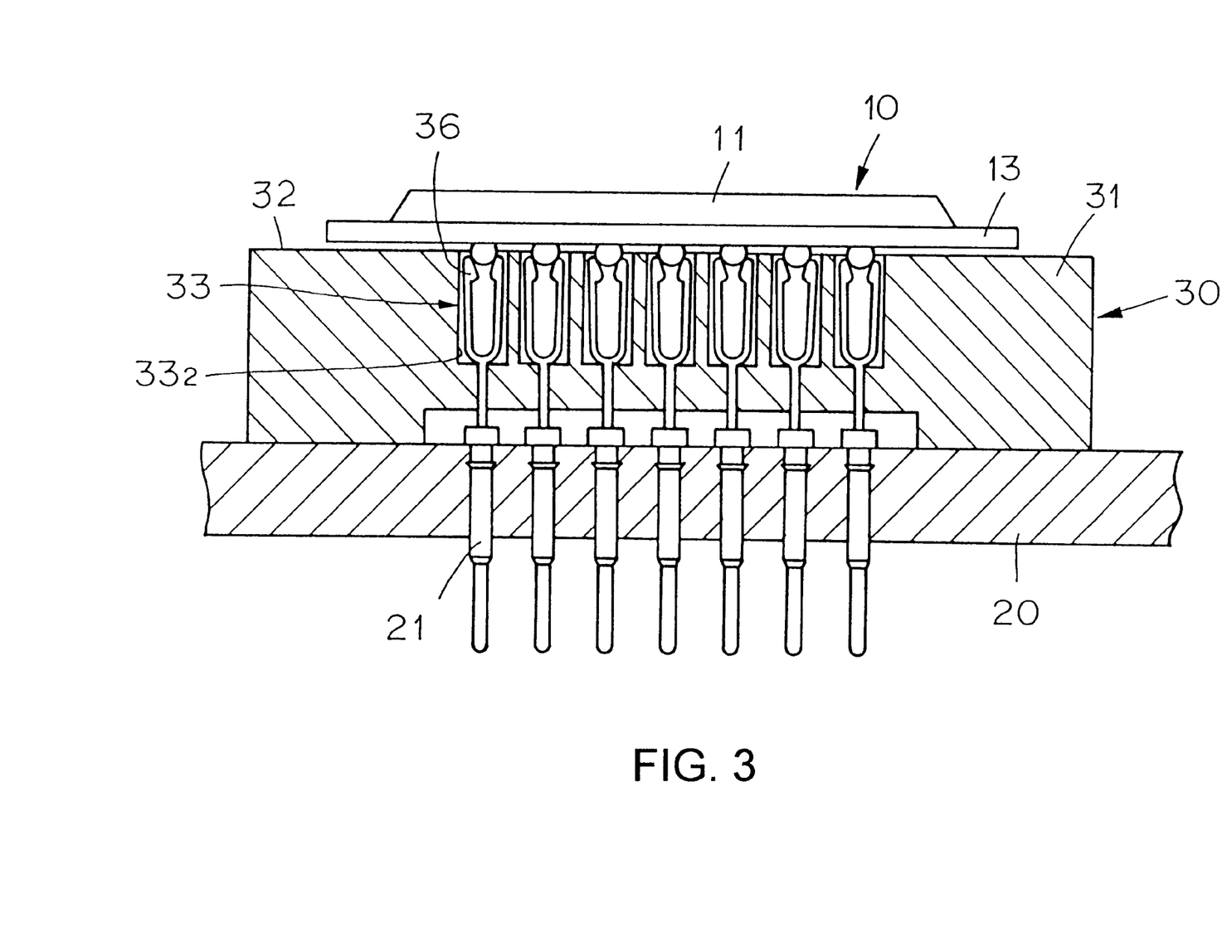
FIG. 3 is a sectional view of FIG. 1 taken along a line B–B in FIG. 1.
Figure 4:
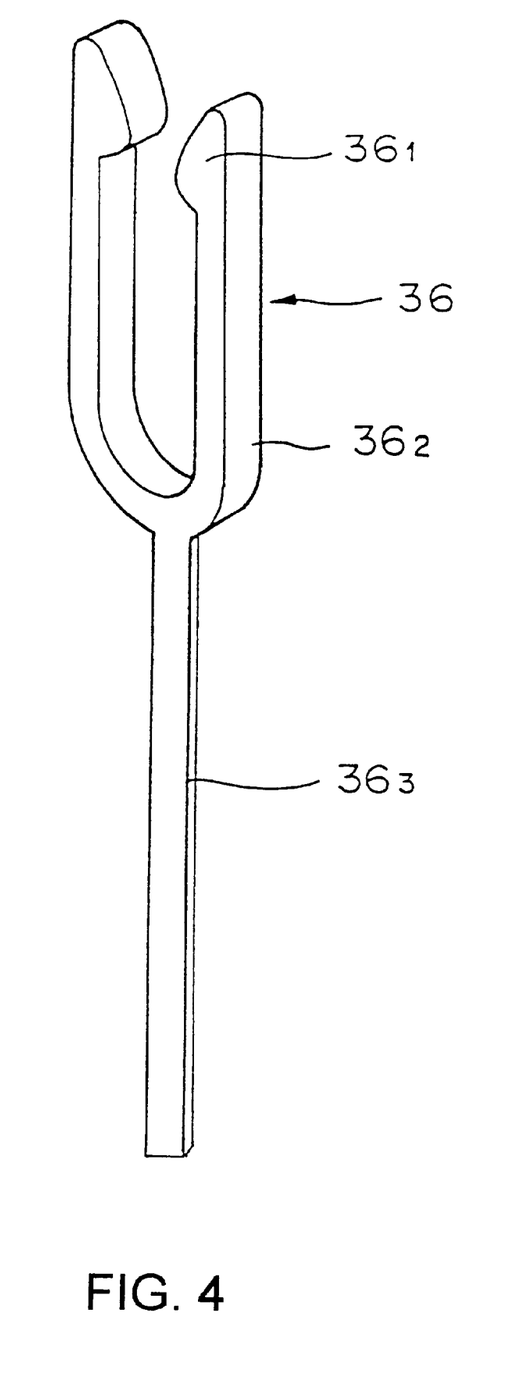
FIG. 4 is a perspective view showing an example of the contact pin used in the BGA package measuring socket shown in FIG. 1.

FIG. 1 is a plan view showing a BGA package measuring socket according to the present invention as looking at from the upper side thereof and is an illustration for explaining the positional relationship between the BGA package measuring socket of the present invention and a conventional BGA package which is indicated by a broken line in the drawing. FIG. 2 is a sectional view of FIG. 1 taken along a line A—A in FIG. 1 in which contact pins are removed. FIG. 3 is a sectional view of FIG. 1 taken along a line B—B in FIG. 1. FIG. 4 is a perspective view showing an example of the contact pin used in the BGA package measuring socket shown in FIG. 1.

As described above, the BGA package 10 comprises an insulating substrate 13 on the surface of which a semiconductor device is mounted and on the rear surface of which solder balls 12 are two-dimensionally arranged in the form of a matrix. The internal circuit or circuits (one or more semiconductor devices, typically an IC) of the BGA package 10 are hermetically sealed by a mold 11 and leads of the internal circuits are electrically connected to the solder balls 12 via the printed circuits or patterns formed on the substrate 13.

As with the prior BGA package measuring socket, the BGA package measuring socket 30 of the present invention is also used to electrically connect between the solder balls 12 to which the input/output terminals (electrodes) of the semiconductor device or devices in the BGA package 10 are connected and a printed circuit board 20 which constitutes a part of an IC tester side with each other. Many through-holes 22 are formed in the printed circuit board 20 in up-and-down direction, namely, vertical direction thereof. Pin-shaped connectors 21 are inserted into and fixed to the corresponding through-holes 22, respectively. Each of the connectors 21 has an engaged recess on its central portion. Since the internal circuit, i.e., the solder balls 12 of the BGA package 10 are electrically connected to the corresponding connectors 21 of the printed circuit board 20, these through-holes 22 are formed at the positions corresponding to those of the solder balls 12 arranged in a matrix on the rear surface of the BGA package 10.

The BGA package measuring socket 30 is provided with a housing 31 which is formed by working a thick plate-like body of an insulating material, and the BGA package 10 is mounted on the upper surface of the housing 31 in case of testing the package 10. Many receiving holes 33 for accommodating forked contact pins 36 to be described later respectively are formed in the housing 31 so as to pierce the housing 31 from the upper surface 32 thereof through the lower surface thereof. These receiving holes 33 are formed at the positions corresponding to those of the solder balls 12 arranged on the rear surface of the BGA package 10 to be mounted on the upper surface 32 of the housing 10.

A forked contact pin 36 is accommodated in each receiving hole 33. FIG. 4 is a perspective view showing an example of such forked contact pin 36. Each of the forked contact pins 36 is formed from a sheet metal having a resilience such as beryllium copper, phosphor bronze or the like by stamping out the sheet metal into a tuning fork shape as shown in FIG. 4. The forked contact pin 36 comprises a strip-like base forming a terminal portion $36_3$ and elastic forked portions $36_2$ branched into two bifurcated portions from the base. The forked portions $36_2$ are formed in parallel with each other. The dimension between the outer surfaces of the parallel elastic forked portions $36_2$ is approximately 1 mm. The tip portion of each of the elastic forked portions $36_2$ forms a contact portion $36_1$ for contacting with corresponding one of the solder balls 12 of the BGA package 10.

The contact surface of each contact portion $36_1$ for contacting with a solder ball 12 is formed to have an upward slope such that it is gradually away from the central axis of the forked contact pin as the contact surface approaches its uppermost portion from its lowermost portion. The angle of the contact surface of the contact portion $36_1$ making with the associated forked portion $36_2$ is approximately 28° in this embodiment. The tip portion of the terminal portion $36_3$ of the forked contact pin 36 is inserted into the corresponding engaged recess of the connector 21 and is electrically connected to the connector 21 which is inserted into and fixed to the corresponding through-hole 22 of the printed circuit board 20 forming a part of the IC tester side.

The shape and the structure of each receiving hole 33 will be discussed. Since the circular recess $33_1$ (a circular hole hollowed downwardly from the upper surface 32 of the housing 31) on the upper portion of each receiving hole 33 is a portion where a solder ball 12 enters to contact with the contact portions $36_1$ of the elastic forked portions $36_2$, its diameter is selected to be slightly larger than the diameter of the solder ball and its depth is selected to be slightly deeper than the diameter of the solder ball 12. In addition, a pair of slits $33_2$ mutually opposing in radius direction are formed on the inner circumference surface of the circular recess $33_1$ such that each slit juts out beyond the inner circumference surface. Each slit $33_2$ is deeply cut downwardly beyond the bottom portion of the circular concave $33_1$. Therefore, each slit $33_2$ forms a pair of slits mutually opposing in the radius direction above the bottom portion of the circular recess $33_1$ and forms a single slit below the bottom portion of the circular recess $33_1$ as understood from FIG. 3. The upper portions of the elastic forked portions $36_2$ are received in the pair of opposing slits and the lower portion ($36_3$) below the elastic forked portions $36_2$ are received in the single slit.

In this case, the radius direction of the circular recess $33_1$ where the pair of opposing slits is formed is selected be oblique against the alignment direction of the receiving holes 33 (in this example, the receiving ho es are arranged laterally and longitudinally to form a matrix). That is, the pair of opposing slits of the upper portion of the slits $33_2$ is symmetrical about the central axis of the receiving hole 33 and a horizontal line running from one slit to the other slit via the central axis is oblique against the alignment direction of the receiving holes 33. On the other hand, the depth of the slit $33_2$ measured from the inner surface of the circular recess $33_1$ toward the outside in the diametrical direction is selected such that the contact portion $36_1$ does not contact with the housing wall when the tips of the contact portions $36_1$ of the pair of elastic forked portions $36_2$ are outstretched by the pressure and the intrusion of a solder ball. The width of the slit $33_2$ (the dimension in thickness direction of the forked contact pin 36) is slightly larger than the thickness of the forked contact pin 36. The length of the slit $33_2$ is approximately equal to the length of the elastic forked portion $36_2$ of the forked contact pin 36. A through-hole $33_3$ connected to each of the slits and piercing through the bottom surface of the housing is formed below the slit $33_2$. The base portion of the terminal portion $36_3$ of the forked contact pin 36 is coupled and fixed to the through-hole $33_3$. By this process, each forked contact pin 36 is fixed to the housing 31.

The BGA package measuring socket 30 is assembled by inserting the forked contact pins 36 into the receiving holes 33 of the housing 31 from the topside and by fixing them integrally with the housing 31. As shown in FIG. 3, each tip portion of the terminal portion $36_3$ of the forked contact pin 36 of the completed BGA measuring socket 30 is inserted into the engaged recess of the connector 21 and engaged thereto which is inserted and fixed to the through-hole 22 of the printed circuit board 20 which is a part of the IC tester side. Then, the BGA package 10 is loaded on the upper surface 32 of the BGA package measuring socket 30 and a downward pressure force is applied to the BGA package 10 to engage the solder balls 12 on the back surface of the BGA package 10 with the respective pairs of the contact portions $36_1$ of the forked contact pins 36 of the BGA package measuring socket 30, and to keep them in the pressure contact state. The force for keeping the pressure contact state is generated by the inward reaction of the elastic forked portions $36_2$ of the forked contact pin 36 caused by the downward pressure applied to the BGA package 10. In such a way, when each solder ball 12 on the back surface of the BGA package 10 is pressure contacted with the corresponding pair of contact portions $36_1$ of the forked contact pin of the BGA package measuring socket 30, the BGA package 10 is electrically connected to the IC tester side and the test by the IC tester can be carried out.

In such a way, in the forked contact pin 36 of the BGA package measuring socket 30 of the present invention, a pair of elastic forked portions $36_2$ having spring characteristic contacts with a solder ball at two points. Therefore, the contact reliability of the forked contact pin 36 of the present invention is improved compared with the conventional contact pin 34 or the probe pin 35 which contacts with a solder ball 12 at one point. In addition, the forked contact pin 36 of the present invention has an advantage that both contact surfaces of the elastic forked portions $36_2$ and the solder ball 12 are cleaned as the solder ball 12 contacts with the contact surfaces of the elastic forked portions $36_2$ having spring characteristic stretching them out. Since the tip of the elastic forked portion $36_2$ is the contact portion $36_1$ with the solder ball 12, even if the central axis of the forked contact pin 36 is slightly displaced from the perpendicular line passing the center of the solder ball, a force pushing the solder ball 12 from one of the pair of elastic forked portions $36_2$ to the other is generated. Therefore, there is an effect that the BGA package 10 self-aligns against the socket 30.

Moreover, in the forked contact pin 36, since the tip of the elastic forked portion $36_2$ is the contact portion $36_1$, the contact pressure to the solder ball 12 is generated in the direction orthogonal to the longitudinal direction of the forked contact pin 36. Since the length of the forked contact pin 36 is not related to the increase of the contact pressure, the length of the forked contact pin 36 can be designed to the required minimum length independently of the contact pressure. Therefore, the floating inductance and the floating capacitance can be decreased. This is preferable for testing at high frequency. Moreover, since the shape and the structure of the forked contact pin 36 are as mentioned above, there is an advantage that the forked contact pin 36 can be produced very simply by only stamping out a sheet metal having a resilience, and thus, the production cost can be reduced. In addition, a forked contact pin 36 for coping with a fine pitch BGA package where solder balls 12 are arranged in high density can easily be produced.

In the BGA package measuring socket 30 of the present invention, the direction where the slits $33_2$ for accommodating the elastic forked portions $36_2$ of the forked contact pin 36 are formed is made oblique, particularly 45°, to the alignment direction of the receiving holes 33 formed on the housing 31 in plan. Therefore, even if the circular recesses $33_1$ of the upper portion are formed closely each other, the adjacent slits $33_2$ are not connected. Thus, there is a remarkable advantage that the packaging density of the forked contact pins 36 can be improved.

What is claimed is:

1. A test socket for temporary connection of a ball grid array (BGA) type semiconductor device having a large number of connecting ball terminals protruding downward from and arranged in a matrix pattern on a bottom surface of said BGA type semiconductor device to a test circuit, said test socket comprising:

a socket body of electrically insulating material having contact receiving through holes arranged in the same matrix pattern as that of the connecting ball terminals so that said connecting ball terminals are received in said contact receiving holes, respectively, when the BGA type semiconductor device is temporarily received on the socket body; and a plurality of contact pins, each accommodated in each of the contact receiving holes; wherein:

each of said contact pins is made of an elastic thin metal sheet having high electrical conductivity and formed in a tuning fork shape to obtain a forked contact pin having a terminal portion at one end and a pair of arms defining a forked portion at the other end, and each of said contact receiving through holes comprises:

a slit recess formed with a predetermined depth from a top surface of the socket body capable of mounting therein the forked portion of each said forked contact pin, a bottom through hole formed at a bottom of the slit recess to reach a rear surface of the socket body through which the terminal portion of each said forked contact pin is passed and extended downward from the rear surface, whereby said terminal portion of each said forked contact pin can be outer connected to the test circuit, and a top circular recess formed atop of the slit recess in the top surface of the socket body in which the pair of arms of the forked portion of each said contact pin accommodated in the slit recess are exposed at tip portions thereof so that each said connecting ball terminal of the BGA type semiconductor device can elastically contact with said tip portions when said semiconductor device is received on the socket body.

2. The socket according to claim 1, wherein each of said forked contact pins is formed by stamping out from a sheet metal having a resilience and electrical conductivity into a tuning fork shape.

3. The socket according to claim 2 wherein:

each of said forked contact pins is formed by stamping out a sheet metal selected from beryllium copper, phosphor bronze, and the tip portions of the pair of arms of the elastic forked portion of each forked contact pin form contact portions for elastically contacting with the connecting ball terminal.

4. The socket according to claim 2 wherein:

each of said receiving holes has opposed areas in which the elastic forked portions of the corresponding forked contact pin are accommodated, and said slit recess is formed in an oblique direction with respect to direction of the alignment of the receiving holes in the matrix pattern in plan view.

5. The socket according to claim 4 wherein said slit recesses in which the elastic forked portions of the corresponding forked contact pins are accommodated are formed in an oblique direction by 45° with respect to the direction of the alignment of the receiving holes in plan view.

6. The test socket according to claim 1, wherein:

said slit recess has a width greater than a dimension between outer surfaces of the pair of arms of the forked portion, a thickness greater than that of the contact pin so as to fasten the contact pin in the slit recess, and a depth greater than a dimension of the forked portion, and said top circular recess has a diameter and a depth greater than that of the connecting ball terminal, respectively.

7. The test socket according to claim 1, wherein said terminal portion of each said contact pin is connected with each of connectors, said connectors being fixed to a printed circuit board of the test circuit in a matrix pattern the same as that of the connecting ball terminals.

* * * * *

UNITED STATES PATENT AND TRADEMARK OFFICE
CERTIFICATE OF CORRECTION

PATENT NO.:     6,069,481
DATED     :     May 30, 2000
INVENTOR(S):    Matsumura It is certified that errors appears in the above-identified patent and that said Letters Patent is hereby corrected as shown below:

[86]  change "Jan. 21, 1998" (both occurrences) to --June 27, 1997--.

[57]  Abstract
      line 12, delete "12".

Column 2,
      line 35, change "construcetd" to --constructed--.

Column 7,
      line 38, change "ho es" to --holes--.

Signed and Sealed this

Twenty-fourth Day of April, 2001

Attest:

NICHOLAS P. GODICI

Attesting Officer     Acting Director of the United States Patent and Trademark Office